(12) United States Patent
Ueno et al.

(10) Patent No.: US 6,297,959 B1
(45) Date of Patent: Oct. 2, 2001

(54) RADIATION STRUCTURE FOR HEATING ELEMENT

(75) Inventors: Hitoshi Ueno; Shigeru Yoshida, both of Saitama (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/437,245

(22) Filed: Nov. 10, 1999

(30) Foreign Application Priority Data

Dec. 7, 1998 (JP) .................................................. 10-346745

(51) Int. Cl.[7] ..................................................... H05K 7/20
(52) U.S. Cl. ........................ 361/704; 361/702; 361/714; 257/706; 257/708; 165/80.3
(58) Field of Search ..................... 361/700, 702–710, 361/712, 690–715, 718–723; 257/690, 622, 177, 181, 688, 792, 706–727, 786, 734, 304, 785, 691, 308, 389, 686; 174/52.4, 252, 16.3; 438/271, 122, 124, 118; 437/208, 204, 211, 217, 219, 212, 213, 214–220; 175/52.4, 252, 16.3; 165/80.2, 80.3, 80.4, 185

(56) References Cited

U.S. PATENT DOCUMENTS

| | | | |
|---|---|---|---|
| 4,172,261 | * 10/1979 | Tsuzuki et al. ................ | 357/81 |
| 4,535,385 | * 8/1985 | August et al. ................. | 361/388 |
| 4,628,407 | * 12/1986 | August et al. ................. | 361/388 |
| 4,777,434 | 10/1988 | Miller et al. .................. | 324/158 F |
| 5,012,386 | * 4/1991 | McShane et al. ............. | 361/386 |
| 5,208,188 | * 5/1993 | Newman ....................... | 437/220 |
| 5,287,247 | * 2/1994 | Smits et al. ................... | 361/707 |
| 5,371,386 | * 12/1994 | Tokunoh et al. .............. | 257/181 |
| 5,481,138 | * 1/1996 | Economikos et al. ......... | 257/773 |
| 5,519,231 | * 5/1996 | Nakashima et al. ........... | 257/181 |
| 5,543,363 | * 8/1996 | Tokunoh et al. .............. | 437/208 |
| 5,599,747 | * 2/1997 | Bhatt et al. ................... | 437/209 |
| 5,644,163 | * 7/1997 | Tsui .............................. | 257/706 |
| 5,905,634 | * 5/1999 | Takeda et al. ................. | 361/704 |
| 5,946,544 | * 8/1999 | Estes et al. ................... | 438/122 |

FOREIGN PATENT DOCUMENTS

360098650A * 6/1985 (JP) ................................ H01L/23/36
410214437A * 8/1998 (JP) ................................ G11B/7/22

OTHER PUBLICATIONS

Japanese Abstract No. 07335793 dated Dec. 22, 1995.

* cited by examiner

Primary Examiner—Leo P. Picard
Assistant Examiner—Michael Datskovsky
(74) Attorney, Agent, or Firm—Sughrue, Mion, Zinn, Macpeak & Seas, PLLC

(57) ABSTRACT

A heating element (IC, transistor or the like) is placed on a printed circuit board and silicon grease is coated on the surface of the printed circuit board side of the heating element. The projection portion of a radiator with a step portion is inserted into the through hole of the printed circuit board and closely contacted with the lower portion of the heating element through the silicon grease. As a result, heat generated from the heating element is transferred to the projection portion of the radiator through the silicon grease and then transferred to the entirety of the radiator. Excessive silicon grease is collected in a step portion provided at the base of the projection portion of the radiator and prevented from leaking to other portion such as a portion on the board.

6 Claims, 2 Drawing Sheets

RADIATION STRUCTURE FOR HEATING ELEMENT

BACKGROUND OF THE INVENTION

1. Field of the Invention

The present invention relates to a radiation structure for radiating heat generated by an electronic part.

2. Description of the Related Art

Conventionally, many electronic parts including an IC (integrated circuit) are mounted on a printed circuit board for an electronic device. Some of these electronic parts generate heat upon operation. Thus, it is required to effectively radiate heat generated from these electronic parts which generate heat (hereinafter called heating elements).

To this end, in the prior art, as shown in FIG. 3, a through hole 7 is formed at a portion of a printed circuit board 3 on which a heating element 1 is mounted. A radiator 4 is provided with a projection portion 5 having an outer diameter slightly smaller than the diameter of the through hole 7 and having substantially same thickness as that of the printed circuit board 3. Heat radiated from the heating element 1 is radiated through the radiator 4. To be more concrete, the projection portion 5 of the radiator 4 is inserted into the through hole 7 provided at the printed circuit board 3. In this case, silicon grease 2 serving as gelled cementing material is coated on the surface of the heating element 1 facing to the printed circuit board 3 or the upper surface of the projection portion 5 of the radiator so as to homogenize the contacting state of the contacting and opposing surfaces of the heating element 1 and the projection portion 5. The radiator 4 is attached to the printed circuit board 3 through a silicon grease layer 20 which is formed by coating the silicon grease 2 thereby to join the tip end of the projection portion 5 of the radiator 4 to the heating element 1.

According to such a configuration, heat generated from the heating element 1 is radiated in a manner that the heat is transferred to the projection portion 5 of the radiator 4 through the silicon grease layer 20 and further diffused to the entire portion of the radiator.

However, according to the configuration of FIG. 3, at the time of inserting the projection portion 5 of the radiator 4 into the through hole 7 of the printed circuit board 3, it is required to finely adjust an amount of the silicon grease 2 coated on the surface of the heating element 1 facing to the printed circuit board 3 and the upper surface of the projection portion 5 of the radiator 4. Thus, there arises a problem that the attaching procedure is complicated. To be more concrete, if an amount of the silicon grease to be coated is too small, predetermined radiation effect can not be obtained. In contrast, if the amount of the silicon grease to be coated is too much, excessive silicon grease 2 leaks or escapes out of the radiator through the space formed between the printed circuit board 3 and the radiator 4, whereby the leaked grease adheres to a hand of a worker or the parts on the printed circuit board 3 or the like thereby to degrade the workability. Accordingly, it is required to adjust an amount of the silicon grease by taking both the radiation effect and the workability of the attaching procedure into consideration.

SUMMARY OF THE INVENTION

The present invention is attained so as to obviate the aforesaid conventional problem, and an object of the present invention is to provide a radiation structure for a heating element which can prevent the leakage of silicon grease and improve the workability of attaching procedure without degrading radiation effect.

In order to attain the aforesaid object, according to a first aspect of the invention, there is provided a radiation structure for a heating element in which in a radiation structure for a heating element including a base and a projection portion provided at the base, wherein a heating element is placed on a through hole provided at a printed circuit board, and the projection portion is inserted into the through hole from a surface side of the printed circuit board opposing to a surface on which the heating element is placed and contacts with said heating element through gelled cementing material, whereby heat generated by the heating element is radiated outward through the projection portion, characterized in that the base includes a first surface contacting to the printed circuit board on a surface facing to the printed circuit board and at least one step surface provided at a position away from the printed circuit board than the first surface.

According to a second aspect of the invention, there is provided a radiation structure for a heating element according to the first aspect the invention in which the step surface is formed by the first surface contacting to the printed circuit board and a second step surface provided on a side of the first surface opposing to the projection portion.

According to a third aspect of the invention, there is provided a radiation structure for a heating element according to the first or second aspect of the invention, in which the step surface is formed by the first surface contacting to the printed circuit board and a third step surface provided on a projection portion side of the first surface.

According to the aforesaid configuration of the present invention, the heating element is placed on the through hole provided at the printed circuit board and soldered to the surface of the printed circuit board. The radiator is formed by the projection portion fitly inserted into the through hole provided at the printed circuit board and the base for integrally holding the projection portion. The base is provided with a step surface on its surface facing to the printed circuit board. Silicon grease is coated on the surface of the heating element facing to the printed circuit board or the upper surface of the projection portion of the radiator, and then the projection portion is fitted into the through hole provided at the printed circuit board, whereby the base is brought into contact with the printed circuit board at its first surface provided at the portion most close to the printed circuit board. As a consequence, the silicon grease layer is formed between the heating element and the projection portion of the radiator and the printed circuit board and the projection portion of the radiator.

Heat generated from the heating element is transferred to the projection portion of the radiator through the silicon grease layer and further transferred to the entirety of the radiator. Excessive silicon grease leaks or escapes out of the radiator through the space formed between the peripheral surface of the through hole formed at the printed circuit board and the outer peripheral surface of the projection portion of the radiator. However, since the excessive silicon grease is stayed or collected at the space formed by the printed circuit board and the step surface provided at the radiator, the excessive silicon grease is prevented from leaking on the printed circuit board.

DETAILED DESCRIPTION OF THE PREFERRED EMBODIMENTS

Figure 1:
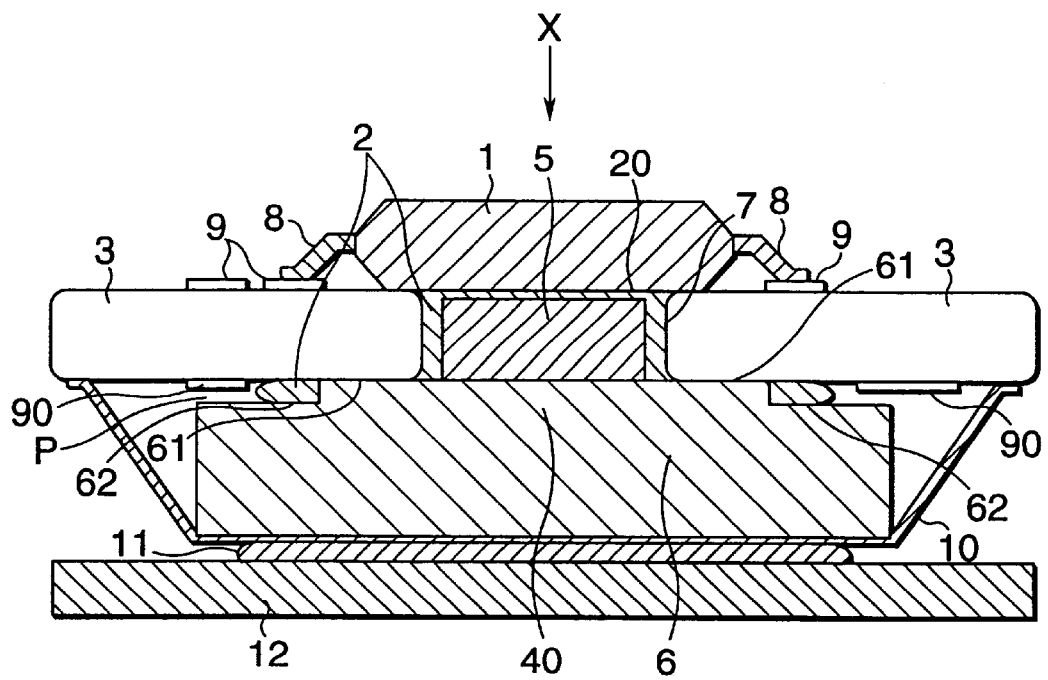
FIG. 1 is a sectional diagram showing the radiation structure for a heating element according to the first embodiment of the present invention.

The first embodiment of the present invention will be explained in detail with reference to FIG. 1. FIG. 1 is a sectional diagram of the radiation structure according to the first embodiment of the present invention wherein a radiator 40 is attached to a printed circuit board 3 on which a heating element 1 such as an IC having lead wires 8 is mounted. The printed circuit board 3 is provided on its surface with a circuit pattern which constitutes a circuit including lands 9 for mounting the heating element 1 on the printed circuit board 3 through soldering procedure. Further, the printed circuit board 3 is provided, at the portion thereof where the heating element 1 such as an IC is mounted, with a through hole 7 having an arbitrary shape such as a rectangular or circular shape when seeing the printed circuit board surface from the X direction in the figure. The through hole 7 is determined in its position at the printed circuit board and the hole diameter thereof in a manner as shown in the figure that at least a part (or preferably entirety) thereof is covered by the heating element 1 in a state where the heating element 1 is mounted on the printed circuit board 3.

The radiator 40 is formed by a projection portion 5 having the outer configuration same as the configuration of the through hole 7 and a base 6 for integrally holding the projection portion 5. The projection portion 5 is inserted into the through hole 7 formed at the printed circuit board 3 and serves to transfer the heat generated by the heating element 1 to a chassis 12 thereby to radiate the heat. The base 6 is provided with step surfaces 61 and 62 on the surface thereof facing to the printed circuit board 3. The radiator 40 contacts with the printed circuit board 3 at one of these step surfaces, that is, the first step surface 61 which is positioned closer to the printed circuit board 3 than the second step surface. Thus, in this contacted state of the radiator and the printed circuit board, a space P having a height corresponding to the difference between the first step surface 61 and the second step surface 62 is formed between the second step surface 62 and the printed circuit board 3. A circuit including lands 90 or small-sized parts or the like capable of being housed within the space P can be mounted within the space P.

A reference numeral 10 depicts a Mylar tape (trade mark) serving as insulative adhesive tape for fixing the radiator 40 to the printed circuit board 3 until the radiator 40 is closely contacted to the chassis 12. The Mylar tape may be eliminated depending on the assembling procedure of the radiation structure. A reference numeral 11 depicts a silicon sheet serving as an elastic member with a high thermal conductivity used for closely contacting the radiator to the chassis 12. A reference numeral 20 depicts a silicon grease layer formed by the assembling procedure described later.

The aforesaid constituent elements of the embodiment are assembled in the following manner. First, the heating element 1 is placed on the lands 9 formed on the wiring pattern of the printed circuit board 3 and the lead wires 8 are soldered to connect the heating element to the lands. Then, the silicon grease is coated on the surface of the heating element 1 facing to the printed circuit board or the upper surface of the projection portion 5 of the radiator 40, then the projection portion 5 of the radiator 40 is fitted into the through hole 7 and then the radiator 40 is fixed to the printed circuit board 3 by means of the Mylar tape 10. Thereafter, the printed circuit board 3 is fixed at a predetermined portion of a not-shown casing in which the printed circuit board is to be housed, and then the silicon sheet 11 is laid between the radiator 40 and the chassis 12, whereby the radiator 40 is closely contacted to the chassis 12 through the silicon sheet 11.

In the aforesaid configuration, the heat generated from the heating element 1 is transferred to the projection portion 5 of the radiator 40 through the silicon grease layer 20, then transferred to the entirety of the radiator including the base 6, then further transferred to the chassis 12 through the silicon sheet 11 and radiated outward of the casing. At this time, excessive grease flows on the upper surface of the base 6 through the space formed between the peripheral surface of the through hole 7 formed at the printed circuit board 3 and the outer peripheral surface of the projection portion 5 of the radiator 40. However, since the base 6 is provided with the second step surface 62, the space P is formed between the second step surface 62 and the printed circuit board 3. Thus, the excessive silicon grease thus flown on the upper surface of the base is collected at the space P, so that the excessive silicon grease can be prevented from leaking outward of the radiator.

Figure 2:
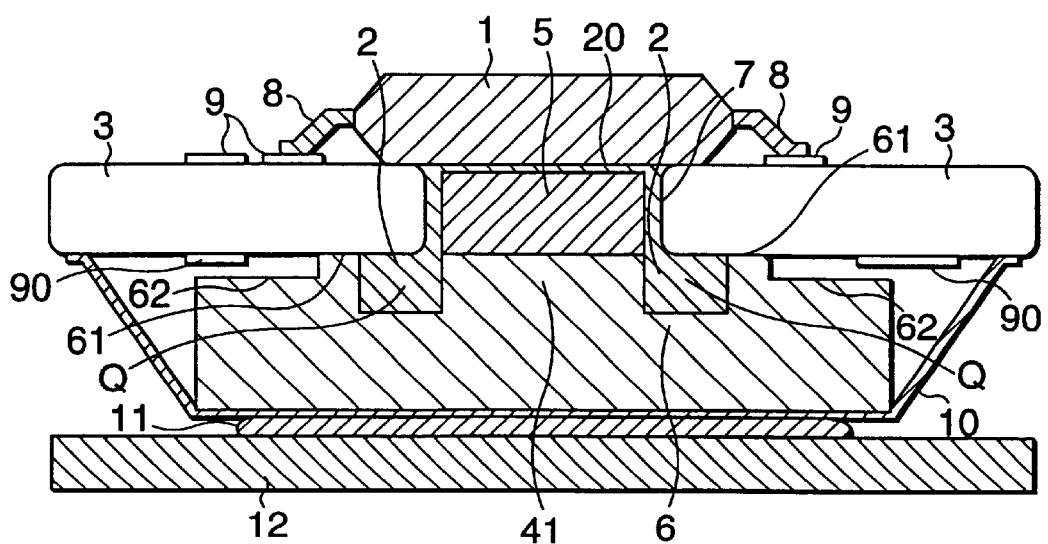
FIG. 2 is a sectional diagram showing the radiation structure for a heating element according to the second embodiment of the present invention.
Figure 3:
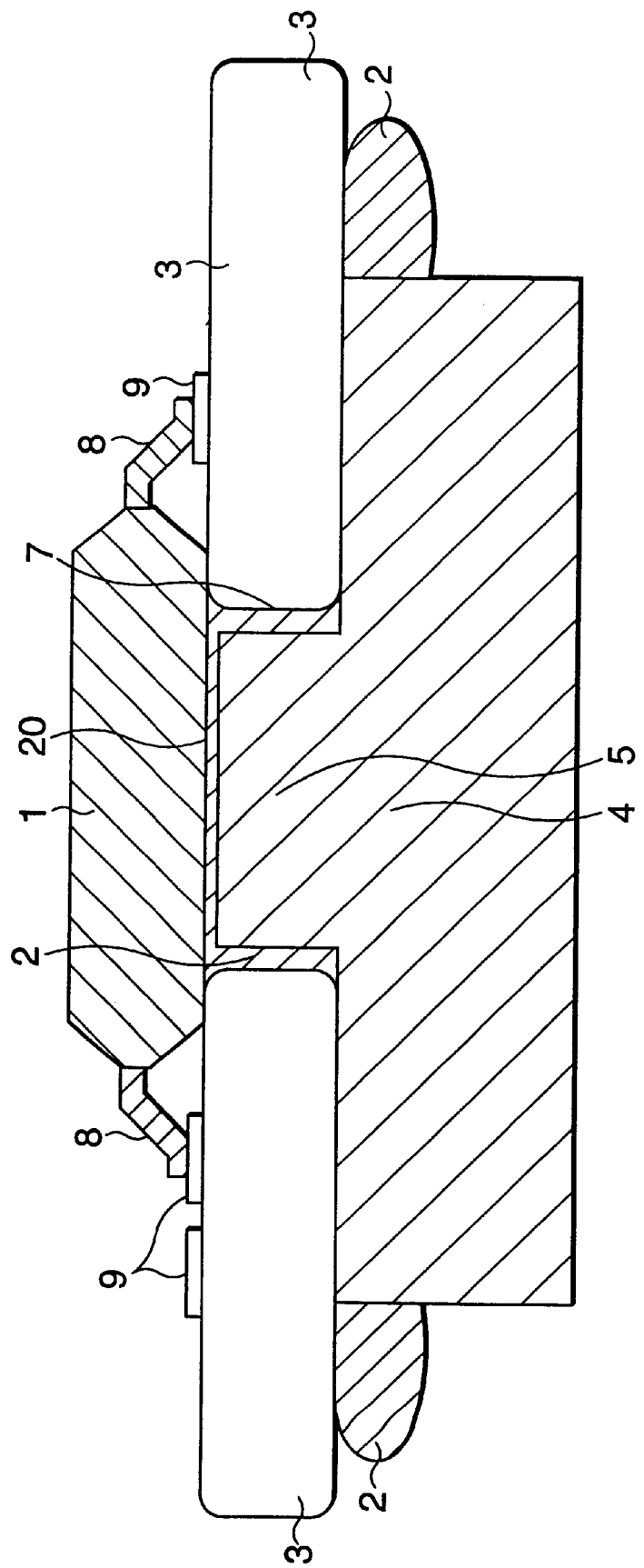
FIG. 3 is a sectional diagram showing the conventional radiation structure for a heating element.

The second embodiment of the present invention will be explained in detail with reference to FIG. 2. FIG. 2 is a sectional diagram of the radiation structure according to the second embodiment of the present invention wherein a radiator 41 is attached to a printed circuit board 3 on which a heating element 1 is mounted. In the figure, portions identical to those of FIG. 1 are referred to by the common symbols, with explanation thereof being omitted.

The base 6 of the projection portion 5 of the radiator 41 is provided with a third step surface 63 on the surface thereof between the projection portion 5 and a first step surface 61 in addition to the step surfaces 61 and 62. The third step surface 63 is formed at the portion further away from the printed circuit board 3 as compared with the first step surface 61 so as to have a difference therebetween so that the radiator 41 contacts with the printed circuit board 3 at the first step surface 61. Thus, in this contacting state, a space Q having a height corresponding to the difference between the first step surface 61 and the third step surface 63 is formed between the third step surface 63 and the printed circuit board 3.

In the configuration of the second embodiment using the aforesaid radiator 41, like the first embodiment, heat generated from the heating element 1 is transferred to the projection portion 5 of the radiator 41 through a silicon grease layer 20, then transferred to the entirety of the radiator, then further transferred to a chassis 12 through a silicon sheet 11 and radiated outward of the casing. At this time, excessive silicon grease flows on the upper surface of the base 6 through the space formed between the peripheral surface of a through hole 7 formed at the printed circuit board 3 and the outer peripheral surface of the projection portion 5 of the radiator 41. However, since the excessive silicon grease thus flown on the upper surface of the base is collected at the space Q which is formed between the printed circuit board 3 and the third step surface 63 provided on the base 6 of the radiator 41, the excessive silicon grease can be prevented from leaking outward of the radiator.

As described above, according to the present invention, excessive silicon grease leaked from the silicon grease layer is collected in the space formed between the printed circuit board and the second or third step surface provided on the base of the radiator and so prevented from widely leaking on the printed circuit board. Accordingly, the present invention is advantageous in that the management of an amount of silicon grease coated at the time of assembling the radiation structure can be simplified and the workability for attaching the radiator can be improved.

Further, since the space is formed at the radiator, a wiring pattern, lands, through holes or the like can be formed on the printed circuit board within the space, so that such an additional technical effect can be obtained that the area of the printed circuit board can be used effectively.

Furthermore, since the space is formed at the radiator in the present invention, even if the volume of the radiator of the present invention is same as that of the conventional radiator, the entire area of the radiator contacting to the air within the casing can be enlarged as compared with the conventional radiator, Thus, such an additional technical effect can be obtained that the radiation effect within the casing can be enhanced.

What is claimed is:

1. A radiation structure for a heating element, comprising:
    a base;
    a projection portion provided at said base; and
    a heating element placed on a through hole provided at a printed circuit board, in which said projection portion is inserted into said through hole from a surface side of said printed circuit board opposing to a surface of said printed circuit board on which said heating element is placed and contacts with said heating element through gelled cementing material, whereby heat generated by said heating element is radiated outward through said projection portion;
    wherein said base includes a step formed by a first surface and a second surface, wherein said first surface supports said printed circuit board at a printed circuit board surface and wherein said second surface is provided at a position further away from said printed circuit board surface than said first surface,
    wherein said first surface is provided between said second surface and said projection portion,
    wherein said radiation structure further comprises:
        a second step formed by said first surface and a third surface,
    wherein said third surface is provided between said first surface and said projection portion.

2. A radiation structure for heating element according claim 1, wherein said third surface is farther away from said printed circuit board than said first surface.

3. A radiation structure for heating element according claim 2, wherein said third surface is farther away from said printed circuit board than said second surface.

4. A radiation structure for a heating element, comprising:
    a base;
    a projection portion provided at said base; and
    a heating element placed on a through hole provided at a printed circuit board, in which said projection portion is inserted into said through hole from a surface side of said printed circuit board opposing to a surface of said printed circuit board on which said heating element is placed and contacts with said heating element through gelled cementing material, whereby heat generated by said heating element is radiated outward through said projection portion;
    wherein said base includes a step formed by a first surface and a second surface, wherein said first surface supports said printed circuit board at a printed circuit board surface and wherein said second surface is provided at a position further away from said printed circuit board surface than said first surface,
    wherein said second surface is provided between said first surface and said projection portion,
    wherein said step comprises a rising surface that connects said first surface and said second surface,
    wherein said rising surface, said second surface, and at least a portion of said printed circuit board surface form a reservoir, and
    wherein said reservoir holds an excess portion of said gelled cementing material flowing from said projection portion.

5. A radiation structure for heating element according claim 1, wherein said step comprises a rising surface that connects said first surface and said third surface,
    wherein said rising surface, said third surface, and at least a portion of said printed circuit board surface form a reservoir, and
    wherein said reservoir holds an excess portion of said gelled cementing material flowing from said projection portion.

6. A radiation structure for a heating element, comprising:
    a base;
    a projection portion provided at said base; and
    a heating element placed over said projection portion, wherein gelled material at least indirectly connects said heating element and said projection portion and wherein a through hole is provided in a printed circuit board and said projection portion is inserted into said through hole;
    a first surface that supports said printed circuit board at a printed circuit board surface;
    a second surface that is provided at a position farther away from said printed circuit board surface than said first surface and is located between said first surface and said projection portion;
    a rising surface that connects said first surface and said second surface,
    wherein said rising surface, said second surface, and at least a portion of said printed circuit board surface form a reservoir, and
    wherein said reservoir holds an excess portion of said gelled cementing material flowing from said projection portion.

* * * * *